United States Patent [19]

Hoffman

[11] Patent Number: 4,783,728
[45] Date of Patent: Nov. 8, 1988

[54] MODULAR POWER SUPPLY WITH PLL CONTROL

[75] Inventor: David C. Hoffman, Los Gatos, Calif.

[73] Assignee: Modular Power Corp., San Jose, Calif.

[21] Appl. No.: 71,586

[22] Filed: Jul. 8, 1987

Related U.S. Application Data

[63] Continuation-in-part of Ser. No. 857,145, Apr. 29, 1986, abandoned.

[51] Int. Cl.[4] ............................................. H02M 5/458
[52] U.S. Cl. .......................................... 363/37; 363/71; 307/82
[58] Field of Search ...................... 307/82; 363/34, 37, 363/65, 71

[56] References Cited

U.S. PATENT DOCUMENTS

| | | | |
|---|---|---|---|
| 3,601,682 | 8/1971 | Iwata et al. | 363/133 |
| 3,697,852 | 10/1972 | Gerbitz | 363/21 |
| 3,872,364 | 3/1975 | Hubner | 363/37 |
| 4,203,151 | 5/1980 | Baker | 363/132 |
| 4,270,163 | 5/1981 | Baker | 363/132 |
| 4,328,454 | 5/1982 | Okuyama et al. | 363/37 |
| 4,349,772 | 9/1982 | Weiss | 363/65 |
| 4,392,099 | 7/1983 | Kuniyoshi | 363/65 |
| 4,399,395 | 8/1983 | Espelage | 363/37 |
| 4,408,270 | 10/1983 | Anderson et al. | 363/132 |
| 4,410,935 | 10/1983 | Dang | 363/41 |
| 4,427,933 | 1/1984 | Wagener et al. | 363/37 |
| 4,432,032 | 2/1984 | Baker et al. | 363/37 |
| 4,447,695 | 5/1984 | Inoue | 363/34 |
| 4,454,574 | 6/1984 | Bush et al. | 363/134 |
| 4,475,150 | 10/1984 | D'Atre et al. | 363/79 |
| 4,553,197 | 11/1985 | Stemmler | 363/37 |
| 4,555,754 | 11/1985 | Hannevin | 363/132 |
| 4,620,296 | 10/1986 | Siemon | 363/37 |
| 4,622,628 | 11/1986 | Murasaki et al. | 363/37 |
| 4,626,978 | 12/1986 | Thouvenin | 363/37 |

FOREIGN PATENT DOCUMENTS 2516247  6/1975  Fed. Rep. of Germany ........ 363/34

OTHER PUBLICATIONS

Farrow et al., "A 300KHz Off-Line Switching Supply Using a Unique Bi-Mos Switch Combination", Power Conversion Internat'l, Sep./Oct. 1980.

Chen et al., "Application of Transistor Emitter-Open Turn-Off Scheme to High Voltage Power Inverters", PESC '81 IEEE Confer.

*Primary Examiner*—Patrick R. Salce
*Assistant Examiner*—Jeffery Sterrett

[57] ABSTRACT

An uninterruptible power supply includes removable individual power modules, which for example may be 10 kilowatts each and are removable from the overall system without adversely affecting the remaining modules. Each module by means of pulse width modulated switching converts the line AC to DC where it is stored by use of capacitors or a battery and then inverted from DC back to AC. This is done on a three-phase basis without need of any low frequency transformer connection. Common input and output control units provide for the basic pulse width modulated switching signals and other necessary signals.

The efficiency and speed of the system is enhanced by the use of cascode switches, saturable cores in transformers and inductors, and a proportional base drive to the switching transistors.

17 Claims, 12 Drawing Sheets

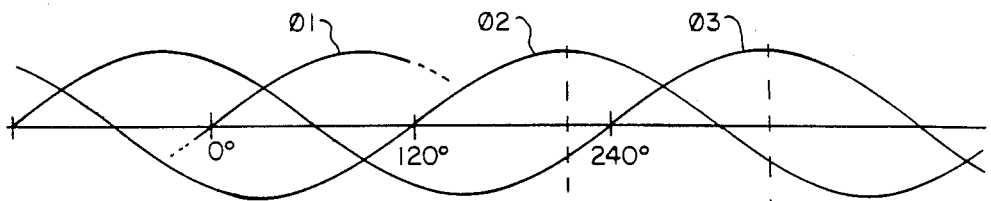
FIG.-3D
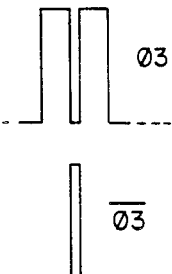
FIG.-3E
FIG.-3F
FIG.-3G
FIG.-3H
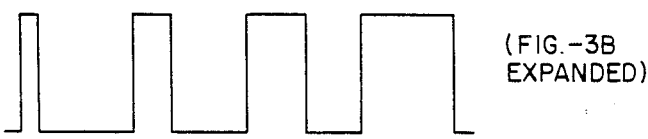
FIG.-3I (FIG.-3B EXPANDED)
FIG.-3J (FIG.-3C EXPANDED)
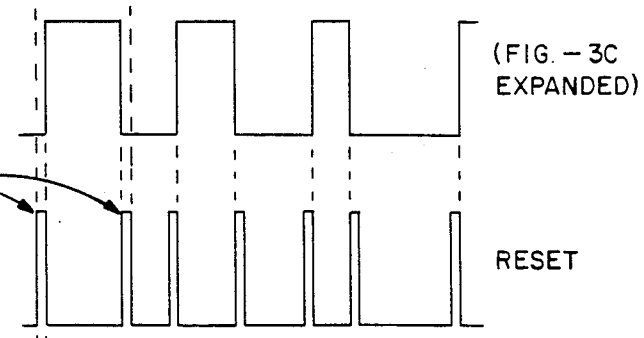
300 n SECS DELAY
RESET
FIG.-3K ← 2 μ SECONDS

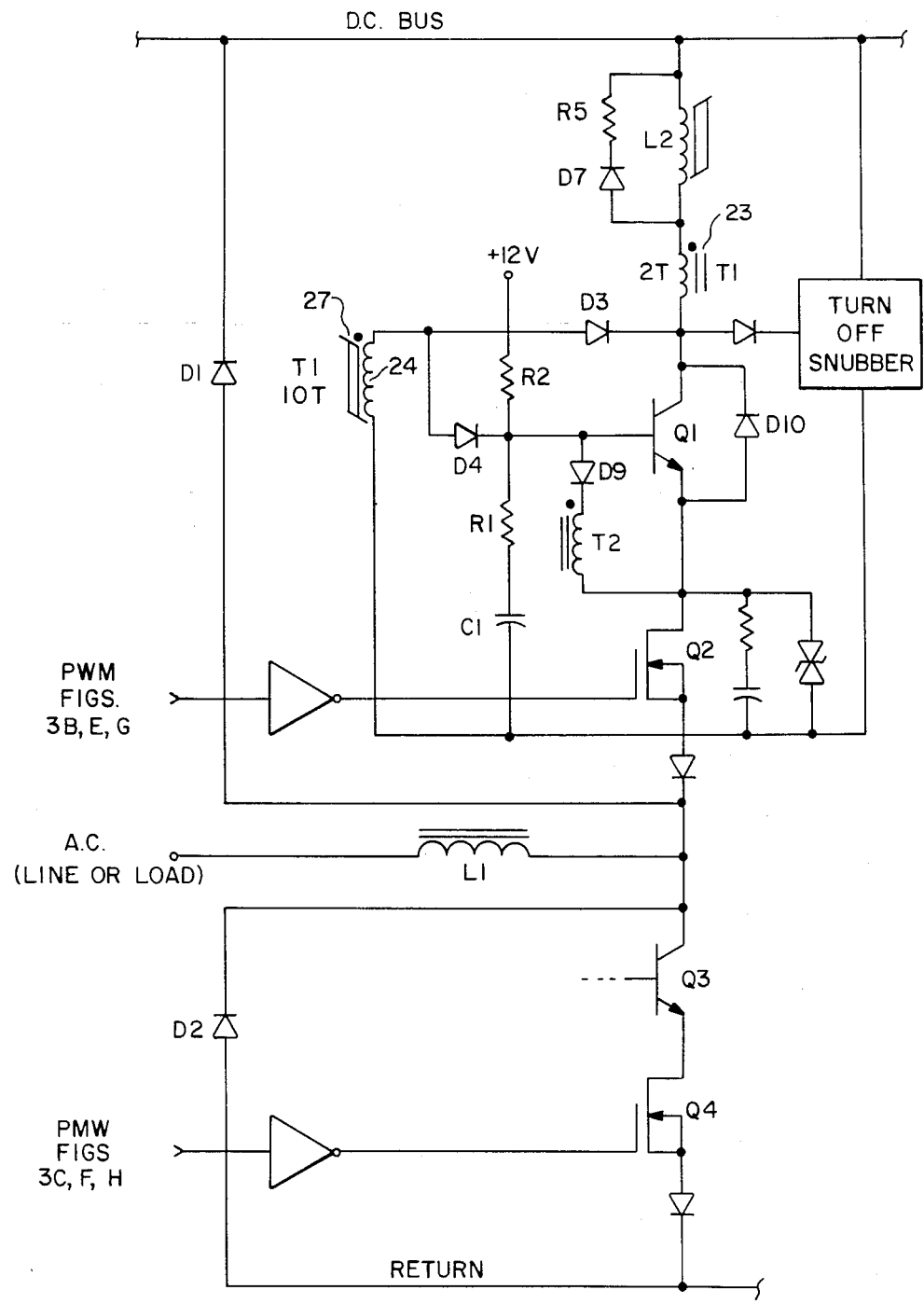
FIG.—4

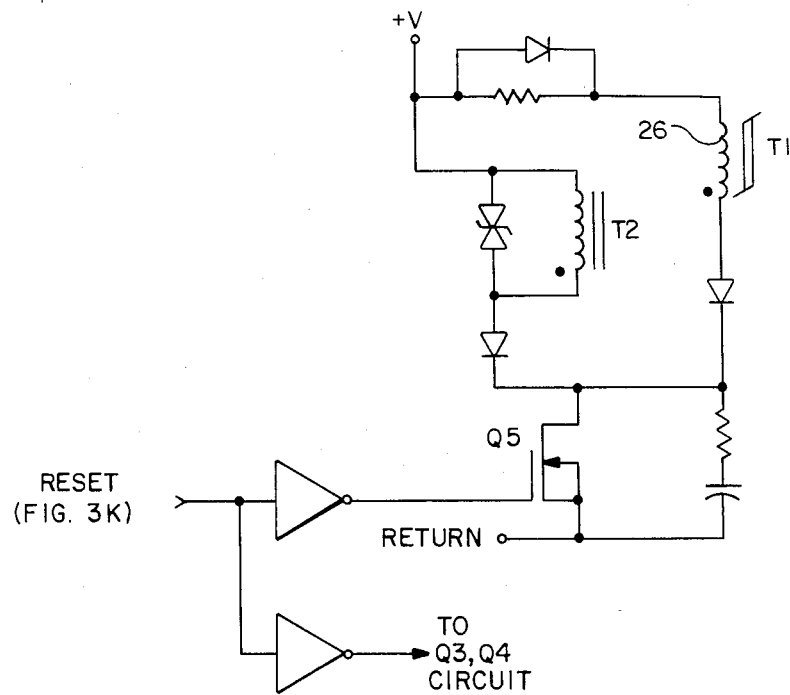
FIG.—4A
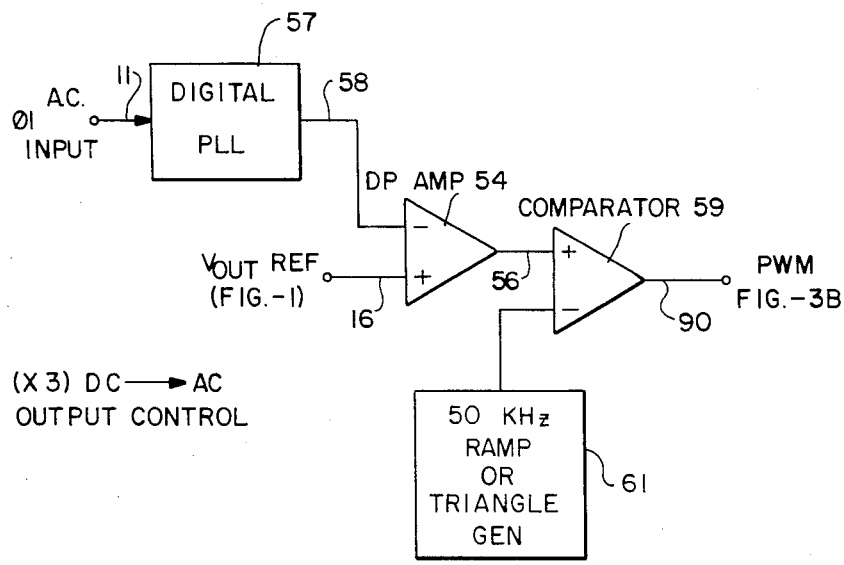
FIG.—6

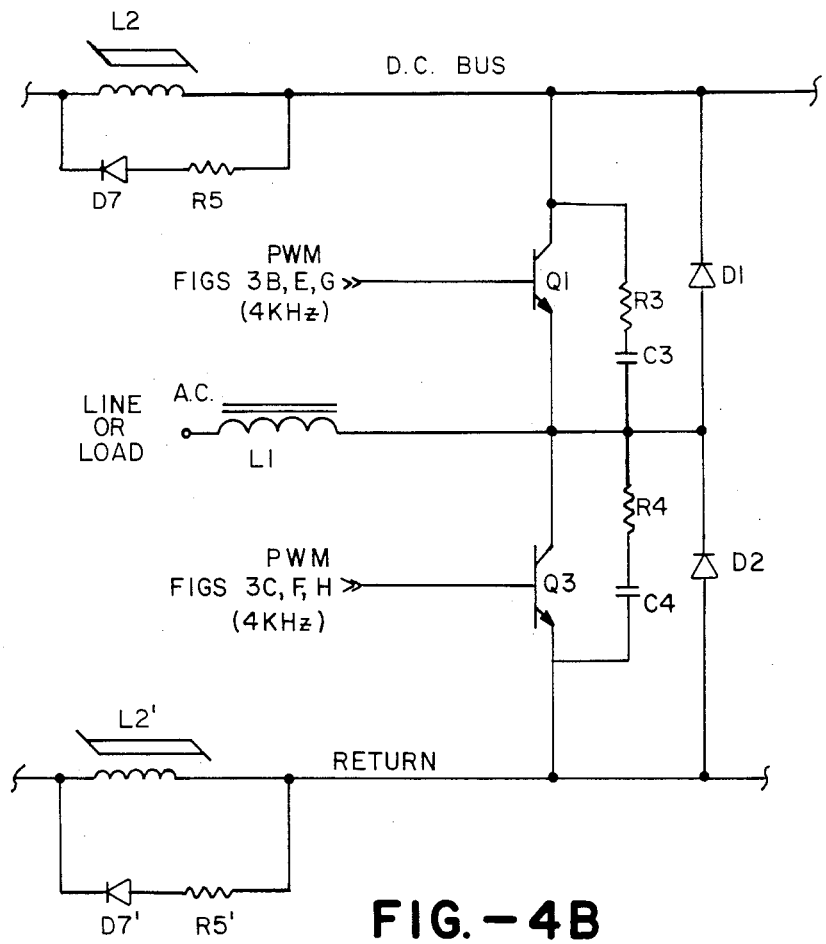
FIG.—4B
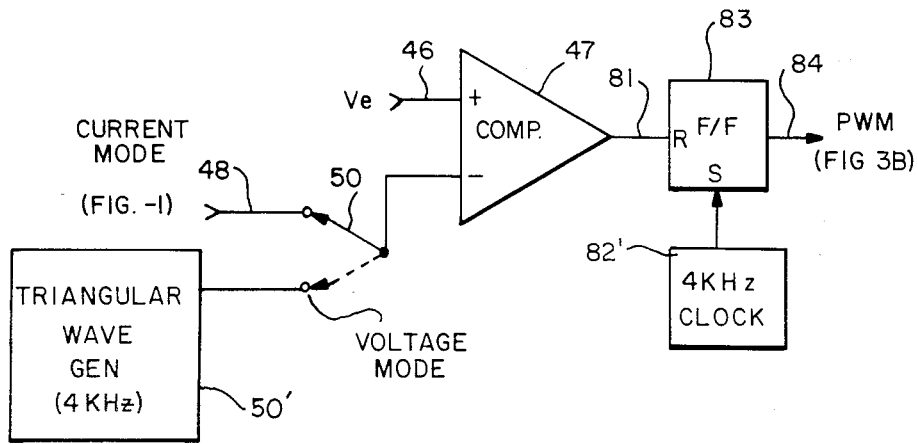
FIG.—5A

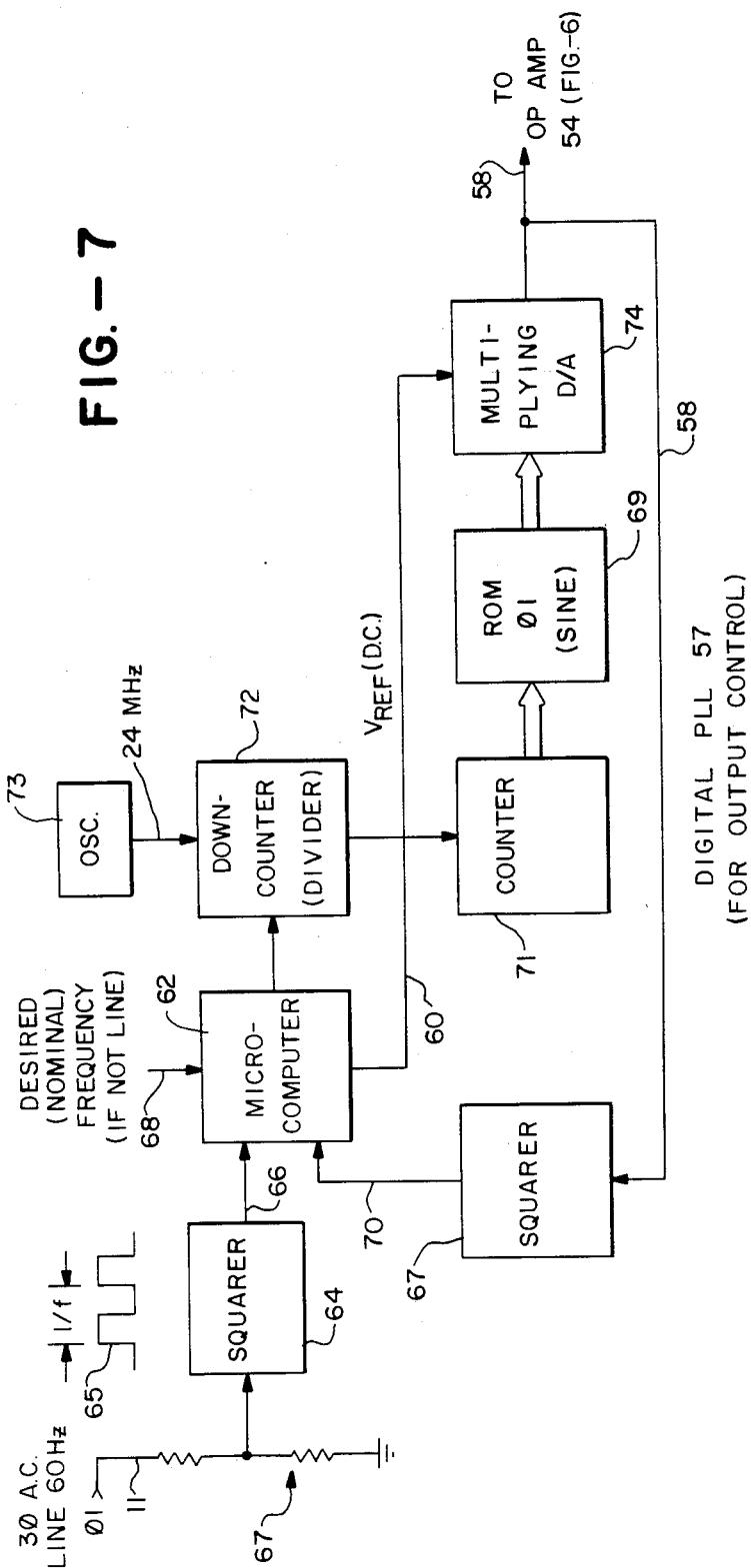

MODULAR POWER SUPPLY WITH PLL CONTROL

This is a continuation-in-part, of application Ser. No. 857,145 filed Apr. 29, 1986 now abandoned.

This invention relates to an electronic power supply and more particularly to an electronic power supply, having power modules, to be utilized as a source of uninterruptible power.

Electronic power supplies of various types have heretofore been provided. Such supplies however in the past have operated at a relatively low efficiency as for example 70–85%. In addition, they have had to be custom designed for each installation. There is therefore need for a new and improved electronic power supply.

In general, it is an object of the present invention to provide an electronic power supply having power modules.

Another object of the invention is to provide a power supply of the above character which is particularly adaptable for use in electronic power supplies used as a source of uninterruptible power.

Another object of the invention is to provide a power supply of the above character which is very efficient.

Another object of the invention is to provide a power supply of the above character which has redundant modules.

Another object of the invention is to provide a power supply of the above character which utilizes a high frequency switching circuit with relatively low losses.

Another object of the invention is to provide a power supply of the above character which utilizes in parallel, for three phases, high voltage, high current relatively slow bipolar transistors, in series cascode combination with low voltage, high current relatively fast MOSFETs to provide a high voltage switch which has high voltage and high current characteristics and a relatively low temperature coefficient.

Another object of the invention is to provide a power supply of the above character which utilizes the above cascode switches in a complementary pair for PWM operation with high frequency carrier and low frequency modulation to generate a low frequency high power alternating current output at relatively low cost.

Another object of the invention is to provide a power supply of the above character which utilizes proportional drive transformers for driving the cascode switches and a turn-off transformer for removing stored charge, independent of load current.

Another object of the invention is to provide a power supply of the above character which utlizes a controlled stored charge removal technique which in turn allows a fast turn-on of the switches.

Another object of the invention is to provide a power supply of the above character in which the core of the drive transformer is reset in a very short period of time to provide up to at least a 90% duty cycle.

Another object of the invention is to provide a power supply of low frequency, low distortion alternating current output and a low frequency, low distortion alternating current input without the use of low frequency magnetics.

Another object of the invention is to provide a power supply of the above character having a low frequency output with less than 3% distortion and an optimum output filter whose size and cost is reduced compared to the conventional approach.

Another object of the invention is to provide a power supply of the above character having a split D.C. bus capacitor at the inverter D.C. bus to provide a fourth wire (neutral) in a three phase system.

Another object of the invention is to provide a power supply of the above character having input line current in phase with the utility voltage and for reducing the current harmonic distortion to less than 3%.

Another object of the invention is to provide a power supply of the above character in which turn on and turn off snubbers are utilized.

Another object of the invention is to provide a power supply of the above character in which a saturating core is utilized for the turn on snubbers.

Another object of the invention is to provide a power supply of the above character in which a novel technique is utilized for resetting the proportional drive transformers.

Another object of the invention is to provide a power supply of the above character in which a digital phase locked loop is utilized.

Another object of the invention is to provide a power supply of the above character in which it is possible to change the slew rate of the frequency.

Another object of the invention is to provide a power supply of the above character in which step changes in frequency are measured so that the new frequency can be selected without any overshoot or undershoot.

Another object of the invention is to provide a power module of the above character which does not require the use of low frequency transformers therefor facilitating redundancy and allowing a wide range of input and output frequencies, and reducing size.

Another object of the invention is to provide a power supply of the above character which is divided into three equal phases.

Another object of the invention is to provide a power supply useful for driving AC motors in battery powered vehicles.

BRIEF DESCRIPTION OF DRAWINGS

FIGS. 3A through 3K are waveforms illustrating various drive signals in the system.

FIGS. 4 and 4A are more detailed circuit schematics of FIG. 2.

FIG. 4B is an alternative circuit diagram to FIGS. 4 and 4A.

FIG. 5A is an alternative circuit diagram for a portion of FIG. 5.

FIG. 6 is a detailed circuit block diagram of another portion of FIG. 1.

FIG. 7 is a circuit block diagram of a portion of FIG. 6.

In general, the power supply of the present invention provides regulated uninterruptible power from an AC or DC source. Each power module consists of an AC to DC converter and a DC to AC inverter with a DC bus connecting the DC output of the converter to the DC input of the inverter. High voltage high frequency switching circuits are utilized in the converter and also in the inverter. Controls are provided for the converter and the inverter which utilize pulse width modulation to control the switching operations of the high voltage high frequency switches utilized in the converter and the inverter.

Additional objects and features of the invention will appear from the following description in which the preferred embodiment is set forth in detail in conjunction with the accompanying drawing.

DETAILED DESCRIPTION OF PREFERRED EMBODIMENT

Figure 1:
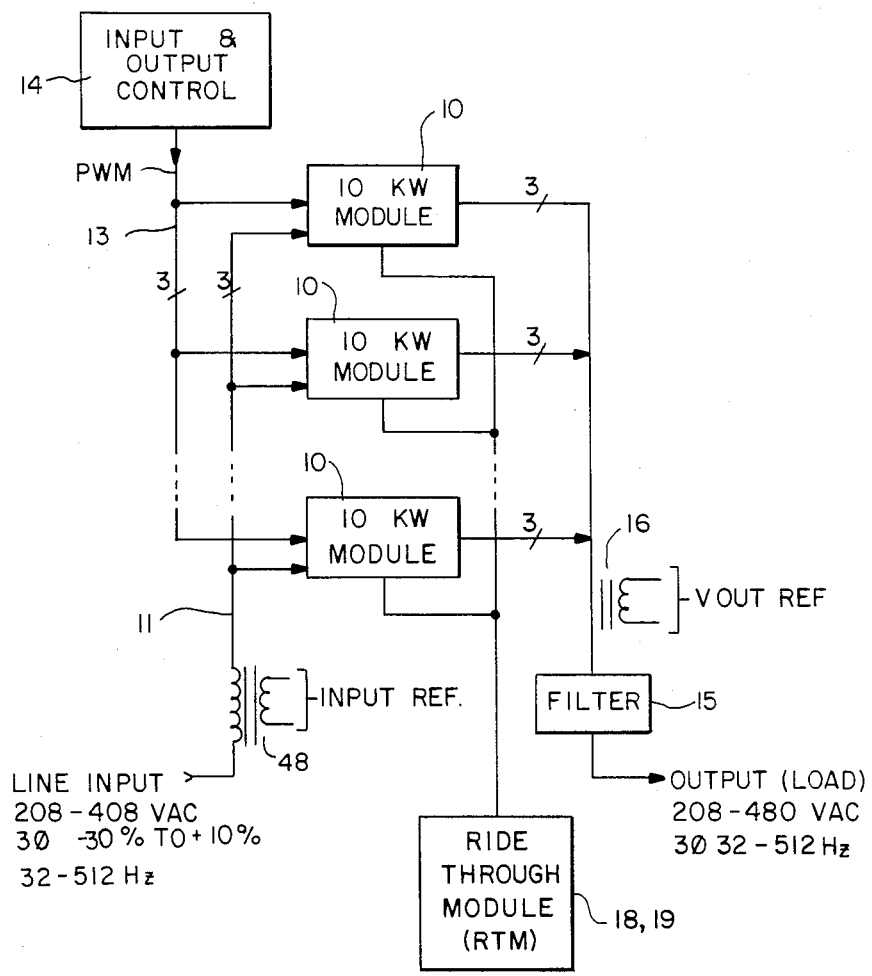
FIG. 1 is a block diagram of a power supply embodying the present invention.

FIG. 1 illustrates an overall block diagram of the power supply which has as its basic components individual power modules 10 which have, for example, a nominal value of power conversion capacity of 10 kilowatts. An input bus 11 which, for example, may be a three-phase standard alternating current line, is connected in parallel to modules 10. Then an output bus 12 also with the modules 10 in parallel, which may also be typically three-phase, provides a regulated, uninterrupted voltage to the output or load.

The AC line source can have a voltage ranging from 208 volts to 480 volts AC with three phase with the voltage fluctuations ranging between −50% and +10% and with a frequency ranging from 32 to 512 Hz. The electronic power supply is also provided with output terminals 12 which will provide a regulated output having a voltage ranging from 208 to 480 volts AC±1% at three phases and a frequency of 32 to 512 Hz. The electronic power supply also includes a ride through module (RTM) 18,19 which as explained in a copending application Ser. No. 857,110, filed 04/29/86 concurrently herewith can be provided with capacitors to provide a short term ride through capability as for example supporting a 10 KW load per module for 100 milliseconds or with backup batteries to provide a long term ride through capability as for example supporting a 10 KW load per module for a period of 5 minutes.

Connected to each of modules 10 also in parallel via the control lines 13 are input and output control units 14. As will be discussed in detail below this provides pulse width modulated (PWM) signals to typically convert the AC to DC which then either charges a storage capacitor or battery to provide the uninterruptible power, and then to invert the DC back to a pure sinusoidal AC waveform. This is all done on a three-phase basis and without the use of low frequency transformers for coupling the various modules 10 together. Any one module or more, in fact, may be removed without adversely affecting the performance of the circuit (except for a reduction in power conversion capacity).

On input line 11 is a current sensing transformer 48 which provides a current $I_{input}$ which will be utilized in the control circuits to be discussed below. Similarly on output line 12 is a voltage transformer 16 to provide an output reference voltage. A high frequency filter 15, e.g., a low pass filter with a cutoff frequency of 3 KHz, is in series with the output to provide attenuation of the carrier frequency, e.g., 25 or 50 KHz.

Figure 2:
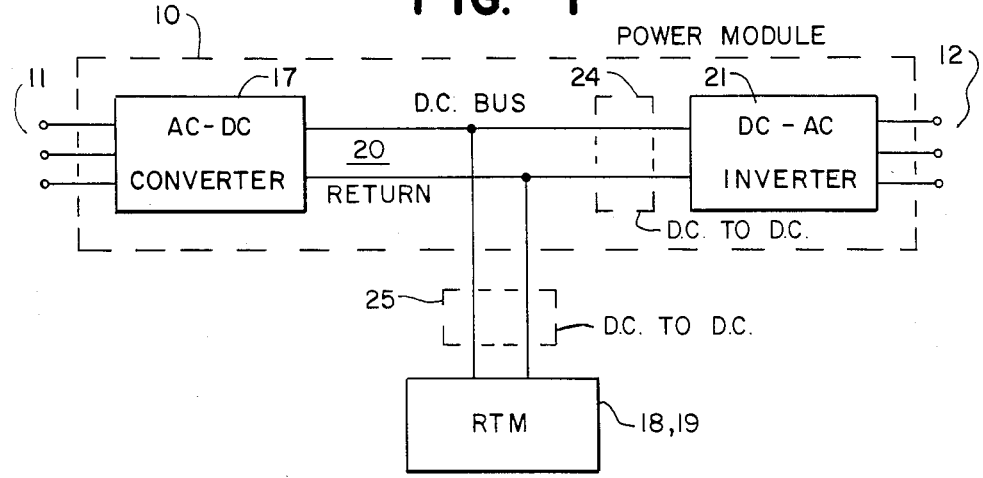
FIG. 2 is a block diagram of a power module of FIG. 1.

The power module 10 is shown in block diagram form in FIG. 2 and consists of an AC to DC converter 17 which has an input coupled to the input terminals 11 and which has a output connected to a DC bus and return forming a link 20. The DC link 20 is coupled to the input of an DC-AC inverter 21 which has its output connected to the output terminals 12. The ride through module 18,19 is connected to the DC links of all power modules 10 as more fully illustrated in FIG. 1.

As an option there may be added to the circuit of FIG. 2 DC to DC units 25 which as shown in dashed outline may be alternatively placed between the DC bus and inverter 21 or RTM 18, 19. This compensates for a decline of DC voltage when operating on a battery. The DC to DC unit 25 is shown in FIG. 2B and essentially is a high frequency inverter 21' whose input is from the converter 17 and the DC bus. The AC output of inverter 21' is transformed (using a high frequency and therefore small transformer) and rectified or converted to again provide DC (at a restored level) for inverter stage 21. DC to DC unit 25 provides (1) a constant DC voltage to the inverter 21 and DC bus utilizing a pulse width control technique (for declining battery voltage during a discharge mode) and (2) optionally provides isolation for the output inverter stage at minimum cost. Inverter 21' and converter 17' are simplified forms of their three phase equivalents 21 and 17.

Figure 2A:
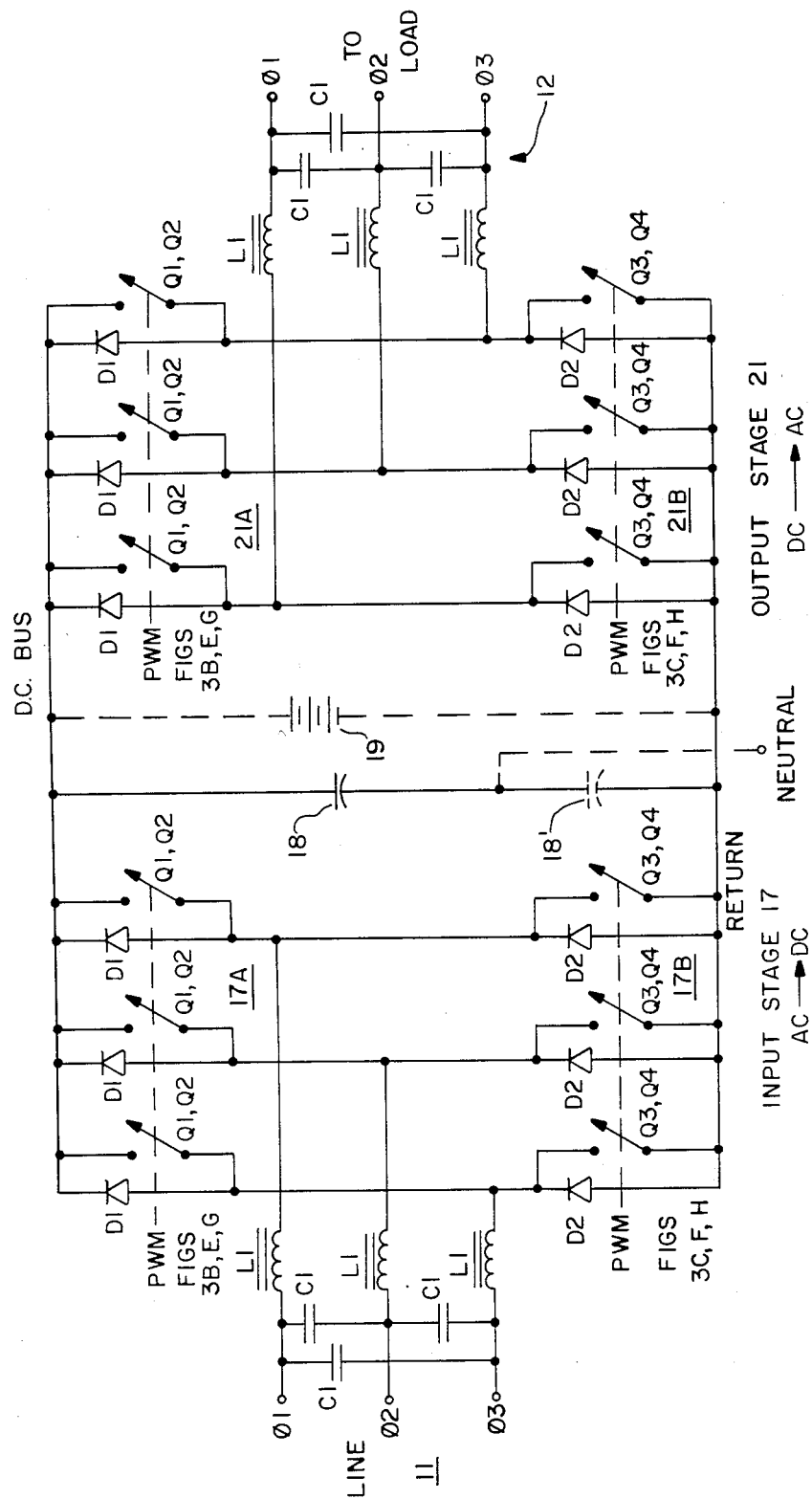
FIG. 2A is a detailed circuit schematic of FIG. 2.
Figure 2B:
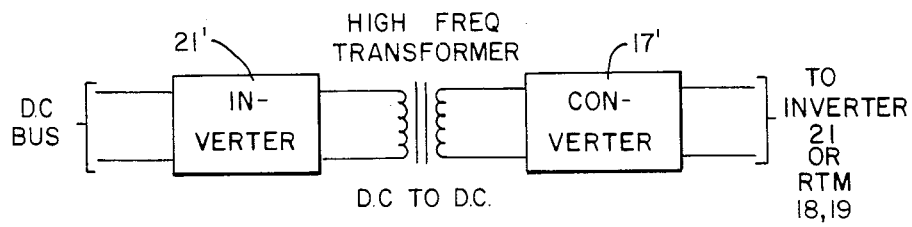
FIG. 2B is a block diagram of an optional modification of FIG. 2.
Figure 2C:
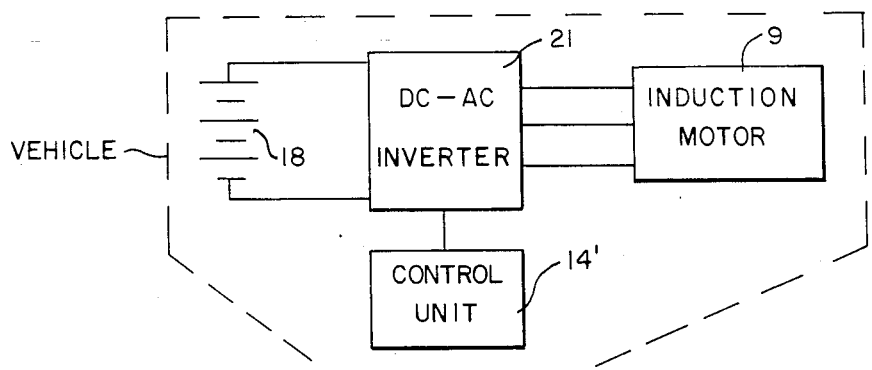
FIG. 2C is a block diagram of a battery powered vehicle embodying the invention.

FIG. 2C is an alternative use of power module 10 where the covverter 17 is eliminated. Thus the power supply always operates in a battery mode for use on a battery powered vehicle. Control unit 14' provides for control of frequency and voltage to the induction motor 9 to facilitate operation as a vehicle; for example perhaps a lower frequency would be used for greater starting torque.

As explained in the above copending application the power modules 10 as well as the ride through modules 18,19 are designed for redundancy in each electronic power supply so that a plurality, and for example in a three phase system at least three of the modules of each type, are provided; and preferably a multiple of three as for example 6 and 12 such modules in any electronic power system.

FIG. 2A is a simplified circuit schematic of one of the power modules 10 which has the three-phase AC line 11 on its input stage side 17. The input stage is coupled by a DC bus and a return line to a ride through module 18, 19 which includes either a storage capacitor 18 and/or a storage battery 19 (with dashed lines) to provide uninterruptible power. To provide a neutral fourth wire, capacitor 18 may be split as shown at 18' and a neutral taken from their junction.

Output stage 21 is in essence an inverter to convert the DC back to AC and provide the output on the three-phase line 12. For both input and output appropriate filtering L1, C1 is provided. In accordance with the principle of duality both stages 17, 21 operate similarly.

With respect to the input stage 17 which acts as a converter from AC to DC it is from a broad standpoint a six diode bridge. In the prior art, such a bridge network might consist of six valves or switches which are closed in a certain sequence. In the case of the present invention both the input stage converter and the output stage inverter provide a much more efficient type of pulse width modulation (PWM) switching circuit. More specifically input stage 17 includes upper switching level 17A and lower switching level 17B. These might be thought of as affecting respectively positive or negative halves of the sine wave. The input stage 17 consists of a six diode bridge with each pair of diodes being connected with the same polarity to a common point forming a pair each pair in turn being connected to one of the phases of the line 11 input and these phases are so designated. The upper switching level diodes 17A are all designated D1 and the lower switching level 17B diodes D2. In parallel with or bypassing each of the diodes is a switch; in the case of upper switching level 17A there are the switches Q1, Q2 and in the lower level 17B, Q3, Q4. All of the diodes and switches are actually identical in circuit design and thus are given common designations in the case of the upper level and the lower level respectively.

In accordance with the principles of duality and with the invention the output stage 21 has an identical organization with upper switching level 21A having the diodes D1 bypassed by switch Q1, Q2, and a lower switching level 21B with a diode D2 bypassed by a switch Q3, Q4 for each phase. The three phase output 12 going to a load is respectively connected to the common point of diode switch junctions as illustrated. The input and output stage are connected between a DC bus and return as was first illustrated in the simplified diagram of FIG. 2.

Figure 3A:
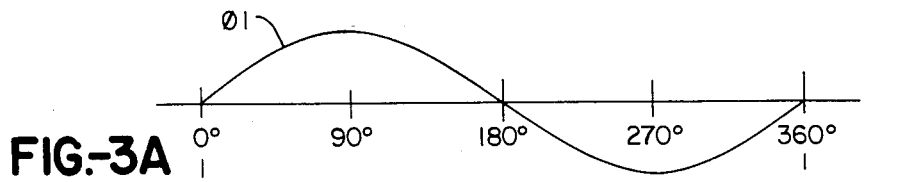
Figure 3B:
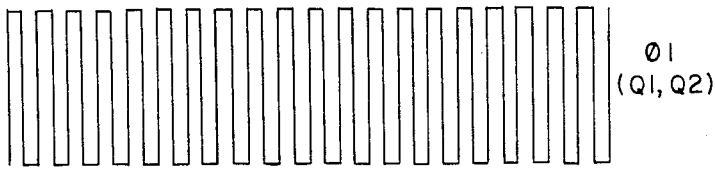
Figure 3C:
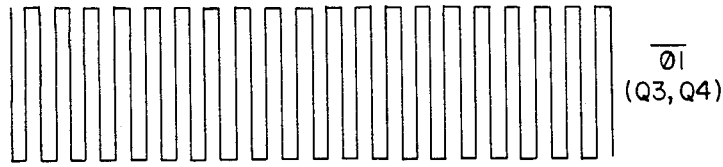

FIGS. 3A through 3H illustrate the closure or actuation of the switches Q1, Q2 and Q3, Q4. In general the switches are closed in accordance with the pulse modulated signals of FIGS. 3B and 3C for phase 1 with FIG. 3C being the complement of FIG. 3B; in other words, when the waveform of 3B is on the waveform of FIG. 3C is off. With respect to FIG. 3B the switch Q1, Q2 associated with phase 1 is so driven; and correspondingly FIG. 3C drives the switch Q3, Q4 also associated with phase 1 of the line input 11. Referring more specifically to, for example, FIG. 3B and comparing it to the sinusoidal or base frequency waveform of FIG. 3A, at the zero crossing of the sine wave of FIG. 3A the pulse width modulation of 3B is at a 50% duty cycle going to a maximum at a 90° or midpoint of the sine wave or its peak, and then returning to the 50% duty cycle. For FIG. 3C the opposite is the situation where the 50% duty cycle starts at 0° approaching a minimum at the midpoint. Then at 180° the situation is reversed. As indicated in conjunction with FIG. 3C the leading edge of the pulse width modulated waveforms are spaced at a 50 KHz or carrier frequency rate. It should be emphasized at this point that though the base frequency is spoken of as 60 Hz, it might typically be 50 Hz (for example for European computer installations) or 400 Hz (for aircraft installations); then the carrier rate, although typically shown in FIG. 3C as 50 KHz, might equally be 25 KHz. Thus to summarize the waveforms of FIGS. 3B and 3C the waveform is modulated by the base frequency rate (i.e., 60 Hz) and pulsated by the carrier rate (i.e., 50 KHz).

The other two phases are indicated in sinusoidal form in FIG. 3D; below them in the case of FIGS. 3E and 3F are the PWM waveforms for phase two and in FIGS. 3G and 3H a representative portion of the PWM waveforms for phase three. These representative portions are shown at the 90° point of the sine waves of FIG. 3D.

As will be discussed in detail below, reset pulses are provided as illustrated in FIG. 3K at a rate double the carrier rate i.e., 100 KHz, by generating a 2 microsecond reset pulse after the occurence of the pulses of FIGS. 3B and 3C illustrated respectively as FIGS. 3I and 3J in expanded form.

Referring back to FIG. 2A this thus represents one 10 KW module 10 with a slight modification that the storage capacitor 18 and battery 19 are located in the common ride through module (RTM) illustrated in FIGS. 1 and 2. In other words, they are common to all power conversion modules.

In general, the pulse width modulated approach for inverting is known. However, it has not been used in high power installations nor where the purity of both the input and output wave forms are essential; for example, in the case of a computer where non-linearities may create unwanted glitches. At the same time, because of the large power requirements of a large sized computer, the input current to the power supply must not be distorted, since otherwise the other sophisticated electronic computers and other instruments on the same power line will be affected. The switching circuit as outlined in FIG. 2A is believed to meet these requirements. This is partially due to the pulse width modulated switching technique which will be described in detail below. Also the arrangement of the switches bypassing the diodes provides for total four quadrant power control.

One type of approach for a power supply has been the stepped wave approach. Here several pulses are combined for a half cycle of the sine wave and are combined to develop a output voltage resembling a sine wave. This approach, however, requires significant filtering which is difficult in a high power system. With the present invention, which will be described in detail below, the output waveform is essentially the base frequency, for example, 60 Hz with a small carrier frequency component of, for example, 50 KHz. This is easily filtered out by a low pass filter as illustrated by the LC filters at the output line 12 and also by the low pass filter 15 illustrated in FIG. 1.

FIG. 4 is a more detailed circuit schematic of one phase of FIG. 2A of either the output stage 21 or the input stage 17. However, only the upper switching level 17A or 21A is fully represented. But in any case the lower level 17B, 21B is identical. The component designations D1, D2, Q1, Q2; and Q3, Q4 of FIGS. 2A and 4 clearly indicate the circuit correspondence. Thus as indicated the AC line with the inductor L1 is connected either to the line 11 or the load 12. Each of the three phases have identical components and differ only in the phase of their PWM control voltages (see FIGS. 3B through 3H) which are 120° apart.

As illustrated in FIG. 4 the switches Q1, Q2 (Q3, Q4) are in the form of a bipolar transistor Q1 (Q3) and a MOS field effect transistor (FET) Q2 (Q4) which are cascode connected. The input of FET Q2 is driven by a pulse width modulated voltage from FIGS. 3B, 3E, or 3G. FET Q4 is driven by FIGS. 3C, 3F or 3H. The two relevant busses, the DC bus and the return bus, are so indicated. Diode D1 is coupled to the DC bus and diode D2 to the return bus providing total four quadrant power control.

From an overall point of view, the circuit of FIG. 4 would be provided for each phase in both the input and output stages and thus in the case of three-phase operation, six of these circuits would be utilized as is apparent from FIG. 2.

Referring now to the cascode connected switches Q1, Q2; (Q3, Q4) of FIG. 4, with this cascode configuration the turn-off time is much more rapid and with a lower storage time. This is of crucial importance where a pulse width modulated conversion technique is being utilized since the more closely the pulse width is controlled the better the purity of the sinusoidal waveform which is produced. In other words a poor pulse width control would distort the waveform and cause a relatively low efficiency and poor power factor. By operating in the cascode mode the bipolar transistor Q1 (Q3) which is high voltage but relatively slow in operation can be combined by tying to its emitter the MOSFET Q3 (Q4) which is low voltage but has very fast switching. Thus, by the use of the foregoing cascode combination a much higher voltage and higher power circuit has been provided compared to prior circuits and at the same time with improved performance. Another advantage of MOSFET Q2 is that it has a positive temperature coefficient. Thus, this corrects for the negative temperature coefficient of bipolar transistor Q1. In summary, the cascode configuration provides the above unique capabilities by use of bipolar transistor Q1 with its emitter connected to a source or drain terminal of MOSFET Q2 which is driven by a pulse width modulated control voltage.

In addition to the cascode switch configuration in order to produce the high quality output waveform several other circuit design features are provided which will be discussed in greater detail. These include a proportional base drive circuit for Q1 (Q3), an antisaturation clamp which basically includes diodes D3 and D4, and control of turn-on base current by use of capacitor C1 and resistor R1, R2 combination.

First with respect to proportional base drive, this provides an optimum ratio of collector current to base current. Thus, for example, if the collector current of transistor Q1 has a range of 20 amperes to 100 amperes it is desirable to have a base current one-fifth of those amounts. In other words, 4 amperes to 20 amperes. Thus there is always some fixed ratio of base current to collector current. In the present circuit, this ratio has been chosen as 5:1 and is provided by transformer T1 where with respect to the winding 23 designated 2T, it is two turns and the other secondary winding 24 is 10T, or ten turns.

Referring to FIG. 4A, this is a reset circuit driven by the pulses of FIG. 3K; the circuit includes windings of transformers T1 and T2 also shown in FIG. 4. The winding 26 is to invert the voltage across the transformer to reset it by means of closure of switch Q5 which is driven by a two microsecond reset pulse from FIG. 3K. This is accomplished at a 50 kHz rate and allows the switch Q1 (Q3) to be conducting up to 90% of the time of a period of the operating frequency since resetting is done within 10% or less of the period. The core 27 of transformer T1 is saturable as indicated.

With respect to the reset pulses (2 μsec) of FIG. 3K, these are timed to occur 500 n.sec after termination of the pulses of 3B and 3C; that is the pulse width modulation. During the 500 n.sec duration the capacitor C₁ charges to the desired voltage. This is due to the collector stored charge and the collector to base current which occur after turn-off. Since the stored charge is directly related to the collector current, the available capacitor voltage increases with an increase in collector current which is a desired feature. The capacitor C₁ provides the initial start up base current for the next turn-on. This feature is an automatic fast turn-on feature for a wide varation of load currents. Typical turn-on time for a 50 Amp collector current is less than 100 n.secs. During the 2 μsec duration the core of transformer T1 resets (and the corresponding transformer for the lower level) immediately before transistor Q1 (Q3) turns on. Thus the proportional drive system is ready to go on a cycle to cycle basis. Also during the same time, transformer T2 provides a reverse voltage between the emitter and base of Q1 and a reverse current path for sweeping the stored charge out of the transistor Q1 (Q3) during the 2 μsec interval immediately after the turn-off of Q2 (Q4). The collector to base stored charge removal is provided by a circuit path via T2, D9 and D10. The voltage ratio of the windings of T2 is chosen to provide enough magnitude of sweep out current during the 2 μsec reset interval.

As is apparent from the circuit the main load current of the switch Q1, Q2 (Q3, Q4) comes from the DC bus through an inductor L2 through the secondary winding 23 and then to the collector of Q1 (Q3). Then the 5:1 ratio of transformer T1 converts this collector current to one-fifth of that value in winding 24 which drives the base of Q1 through D4. Thus in summary the proportional base drive for transistor Q1 (Q3) operates at a 50 kHz frequency which is the same basic switching frequency of bipolar transistor Q1 (Q3).

Referring now to another characteristic which produces the high quality output waveform, and that is the antisaturation clamp. This is provided by the diodes D4 and D3 between the base input of transistor Q1 and essentially the DC bus. This clamp is termed a Baker clamp. Basically it controls the amount of charge that is injected into transistor switch Q1 (Q3).

Thus to summarize the improvements in the circuit of FIG. 4 in order to produce a high quality waveform with the pulse width modulated type of conversion or inversion there is provided (1) proportional base drive to Q1 (Q3), (2) antisaturation clamp D4,D3, (3) a cascode switch configuration in which a slow, high power transistor Q1 (Q3) may take on the characteristics of the fast, low power MOSFET Q2 (Q4), and (4) controlled removal of stored charge by switching the transformer T2 500 n.sec after turn-off.

Connected in series with the switch Q1, Q2 (and also Q3, Q4) is a turn-on snubber. For switch Q1, Q2 it includes a saturable reactor and a clamp D7 and R5 (the clamp is also a part of a turn-off snubber shown as a block). This is necessary to reduce the turn-on stress on the switch when the load current is flowing through the opposite free wheel diode, in this case, D2. For example, referring to FIG. 4A, if switch Q1, Q2 is turned on when D2 is carrying the full load current, (a typical situation in PWM inverters), there will be a virtual short across the DC bus via Q1, Q2 and D2 until D2 recovers. The current amplitude and rate of rise is controlled by the circuit inductance; and it is obvious that the switch operating condition can exceed the safe operating area. "L2", the intentional added inductor, controls the peak current and the rate of rise during this condition. L2 is selected to be a saturable inductor, and its saturation characteristic is designed based on the reverse recovery time of the freewheel diode. Because of the use of the saturating core of inductor L2, a much smaller, cheaper inductor can be utilized which in effect can be a large bead of core material with wires extending through it. Because of this construction and the saturable core it stores much less energy so that at turn-off the energy in L2 which has to be disposed of by the turn-off snubber is very small. This saves power, meaning higher efficiency of operation. It also allows the turn-off snubber to be made smaller.

Figure 5:
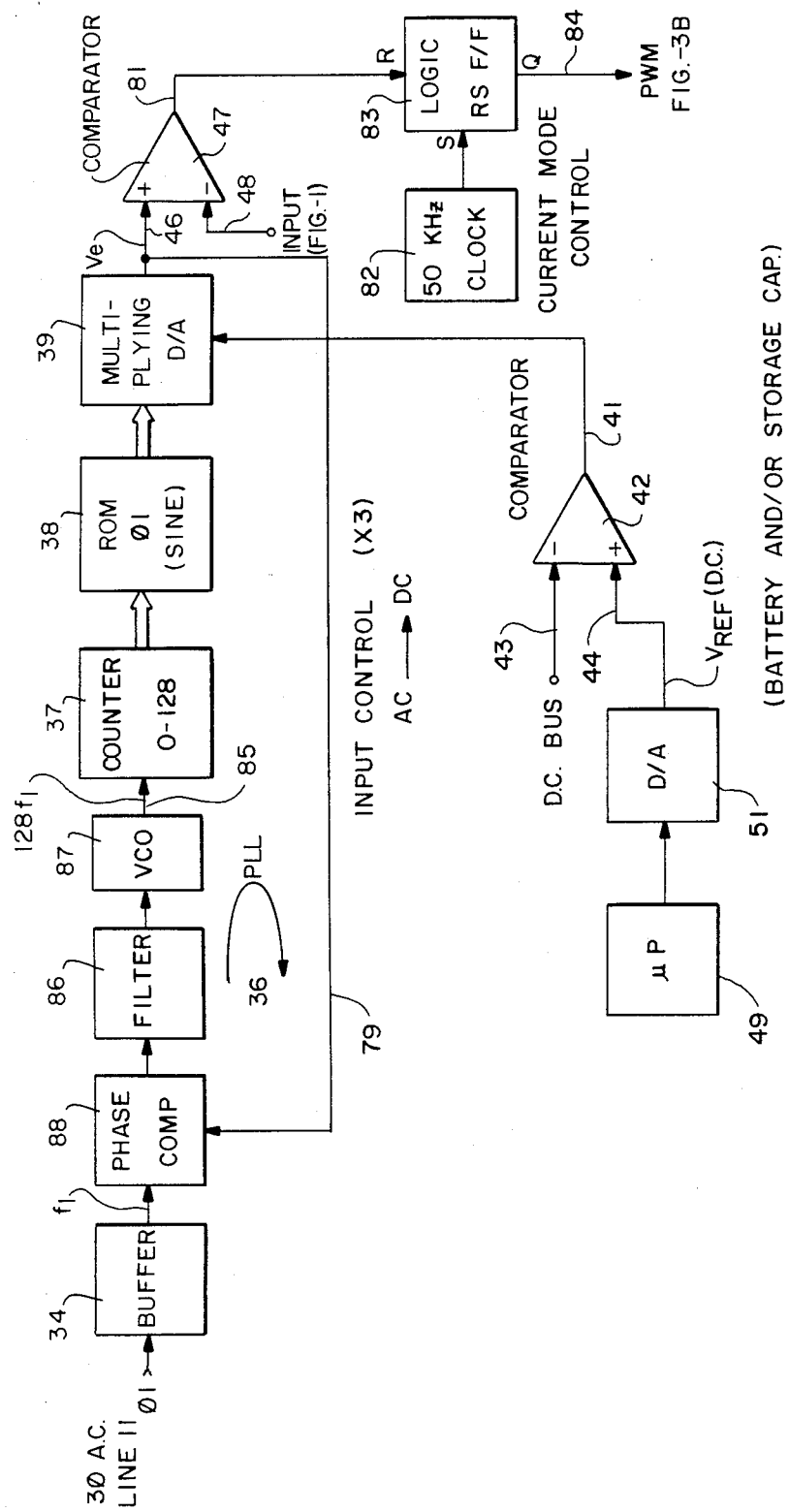
FIG. 5 is a detailed circuit block diagram of a portion of FIG. 1.

As shown in conjunction with FIG. 1, the various control voltages of FIGS. 3A through 3K are produced in the input and output control units 14 which drive the power modules 10. FIG. 5 is a block diagram of the input stage 17 control unit and FIG. 6 a block diagram of the output stage 21 control unit. Naturally these units would be duplicated at least in some part for each of the three phases of power. The generation of the complementary control voltages and their phase shifted equivalents as shown in FIGS. 3C-3H have not been shown since they are easily derived from the illustrated circuitry.

Referring to the input control unit of FIG. 5, this controls the power circuit which converts the input line from AC to DC which is applied to the DC bus. The output of the circuit of FIG. 5 is the pulse width modulated waveform of FIG. 3B, which is placed on the bus 13 (FIG. 1) going to the individual power modules. The input is, at least for one of the phases, from the AC line 11 through a buffer 34 which outputs the nominal AC line frequency of $f_1$. This is coupled into a phase locked loop (PLL) circuit 36 which generates on the output 25 of voltage controlled a frequency of 128 $f_1$ which drives the counter 37. This counter counts from 0 to 128, for each cycle of the frequency $f_1$, addressing individual bytes in ROM 38. Stored in these sequential bytes in the ROM are digital representations of the analog voltage appropriate for that particular time in the sine wave. Then this artificial sine wave is multiplied in the multiplying digital to analog converter 39 by a signal on line 41 from the comparator 42.

Comparator 42 in essence compares the DC bus voltage on line 43 to a desired reference voltage on line 44, and produces a voltage on line 41 proportional to the difference between the DC bus voltage and the DC reference voltage. This technique produces a reference sine wave $V_e$ on output line 46 of the multiplying digital to analog converter 39 whose amplitude is proportional to the difference between the DC bus voltage and the DC ref voltage. The reference voltage, $V_e$, is compared to the input current, $I_{input}$ on line 11 (see FIG. 1) which is sensed by transformer 48. The resultant output on line 81 is then processed by logic unit 83 (which includes an RS flip-flop driven by a 50 KHz clock 82) to provide on output 84 a pulse width modulated (PWM) waveform. This waveform is of the type as illustrated in FIG. 3B and is used to drive the power circuitry that converts AC to DC.

The level of the DC reference voltage 44 is determined by means of a microprocessor 49 in combination with a digital to analog converter 51 and is either set by the requirements of the storage battery or the storage capacitor (see FIGS. 2A,18,19). The pulse width modulated waveform at 84 is in summary such that the duty cycle of the waveform is proportional to reference sine wave 46 (which is in turn proportional to the difference between the actual and the desired output DC voltage) and to the input sine wave current reference 48. In general a low DC bus voltage 43 causes the amplitude of the reference sine wave 46 to increase which then increases the duty cycle of the PWM waveform at 84 and therefore the input current 48 and finally increases the DC bus voltage. This is well known as current mode control and is used in this application as a means of regulating the DC bus, limiting input current to a maximum peak value and assuring close to unity power factor at all times. Logic network 83 guarantees the maximum allowable duty cycle is not exceeded in order to allow time for the circuit of FIG. 4 to be reset. The use of $I_{input}$ 48 also ensures that any non-linearity in this signal will be compensated for.

PLL 36 in effect is connected as a frequency multipier due to counter or divider 37. It includes a phase comparator 88 and a filter 86 driving the voltage controlled oscillator (VCO) 87. Feedback to comparator 88 is on line 84 from the Ve output 46.

FIG. 6 is an output control unit for the output stage which converts DC to AC. On its output 90 it provides a pulse width modulated waveform similar to FIG. 3B. A reference AC waveform is produced by the digital phase locked loop 57. Thus on line 58 a signal having the desired reference amplitude (and frequency) is produced. Then this signed is compared by operational amplifier 54 with $V_{out}$ which is taken at transformer 16 from the output line 12 as illustrated in FIG. 1. Operational amplifier 54 provides a signal on line 56 which drives a comparator 59. The other input to the comparator 59 is a ramp or triangle wave 61. The output 90 of the comparator 59 is then a pulse width modulated signal whose duty cycle is proportional to the level of the comparator input signal 56.

The input to the digital phase locked loop 57 is a phase of the actual AC input to phase lock the output frequency to the input frequency. This is necessary in case of malfunction of the uninterruptible power supply where line voltage must be directly applied to the load. As will be discussed in conjunction with FIG. 7, a synthesized or different frequency other than the line frequency can be utilized if desired.

Figure 8A:
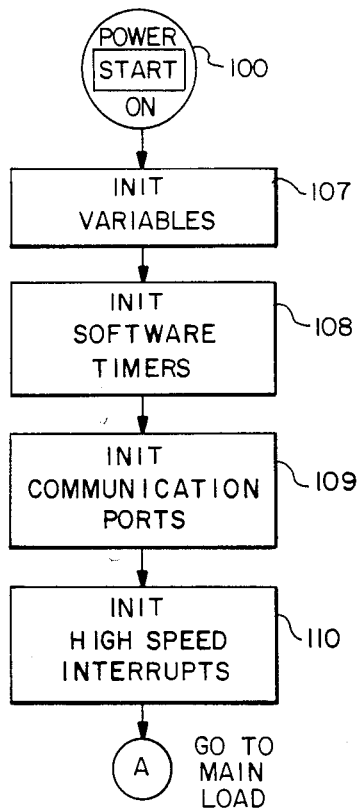
FIGS. 8A, 8B, 8C, and 8D are flowcharts showing the operation of a microprocessor of FIG. 7.

The digital phase locked loop 57 is illustrated in greater circuit detail in FIG. 7. From a generalized control standpoint the conversion of DC to AC has several inherent problems with regard to setting the frequency which include the proper frequency transient response, preventing overshoot or undershoot of frequency, providing a reasonable slew rate from one frequency to another, providing a digitally programmable frequency synthesis (in other words, changing to a frequency other than the line frequency), and where necessary when a shift from a synthesized frequency to line frequency is desired, providing a suitable locking range. The digital phase locked loop (PLL) of FIG. 7 provides this in conjunction with its microcomputer 62 and the flowcharts for the microprocessor's operation are illustrated in FIGS. 8A, 8B and 8C.

Referring to FIG. 7 the phase one of the input line 11, is fed through voltage divider 63 to a squaring circuit 64 which produces the waveform 65 on line 66. This is coupled into the microcomputer 62 which senses the frequency and phase. The feedback from the output 58 through squaring unit 67 is compared so that the phase of the output may be exactly phased in with the line frequency. If this is not possible or desired, then a digital input 68 allows any other nominal or desired frequency to be produced. This may be used in conjunction with the vehicle control of FIG. 2C. The ROM 69 which contains 128 bytes provides a very close digital approximation of a sine wave. Each of these bytes is at a different address which is addressed sequentially by the counter 71. This is the same type of sine wave generation as in FIG. 5. The counter clock frequency thus determines the frequency of the sine wave. This is determined by the down counter 72 which is clocked by a, for example, 24 MHz oscillator 73. Thus, the down counter counts down from the number supplied by the microprocessor and is in essence dividing by that number. Thus if the microprocessor 62 wishes the frequency of the sine wave to increase, it will place a small number into divider or down counter 72 and vice versa. In general the microprocessor 62 looks at the period of the input frequency and the period of the output frequency via the input lines 66 and 70 and makes these periods equal. Then it momentarily either increases or decreases the output frequency to provide an exact phase locking.

Lastly, the sine wave output of ROM 69 is processed in multiplying digital to analog converter 74 where the DC reference from line 60 of microcomputer 52 determines the amplitude of the output voltage 58 with the phase locked frequency being supplied by the digital PLL.

Figure 8B:
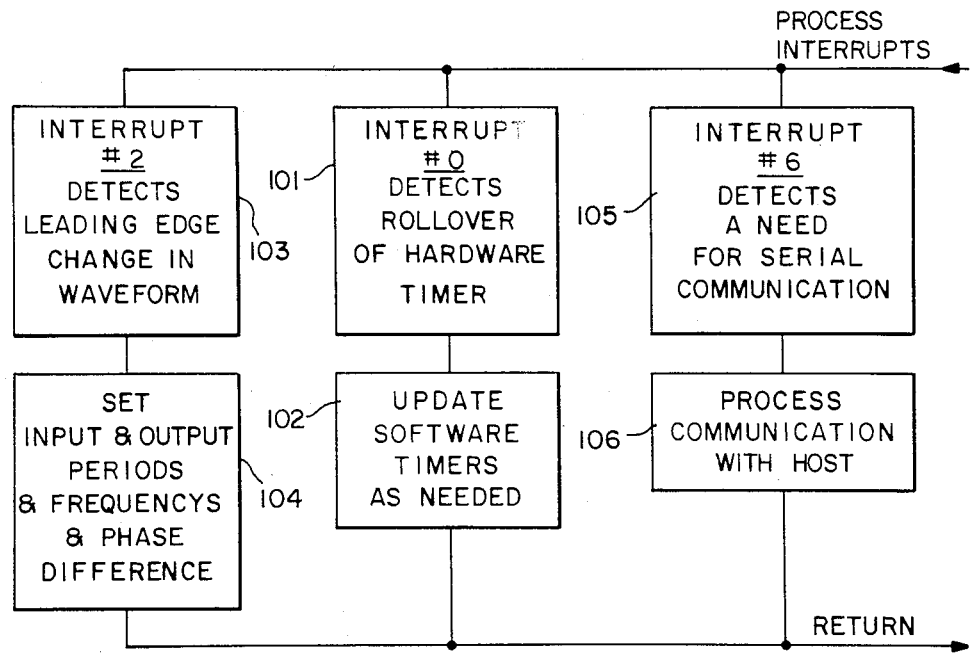
Figure 8C:
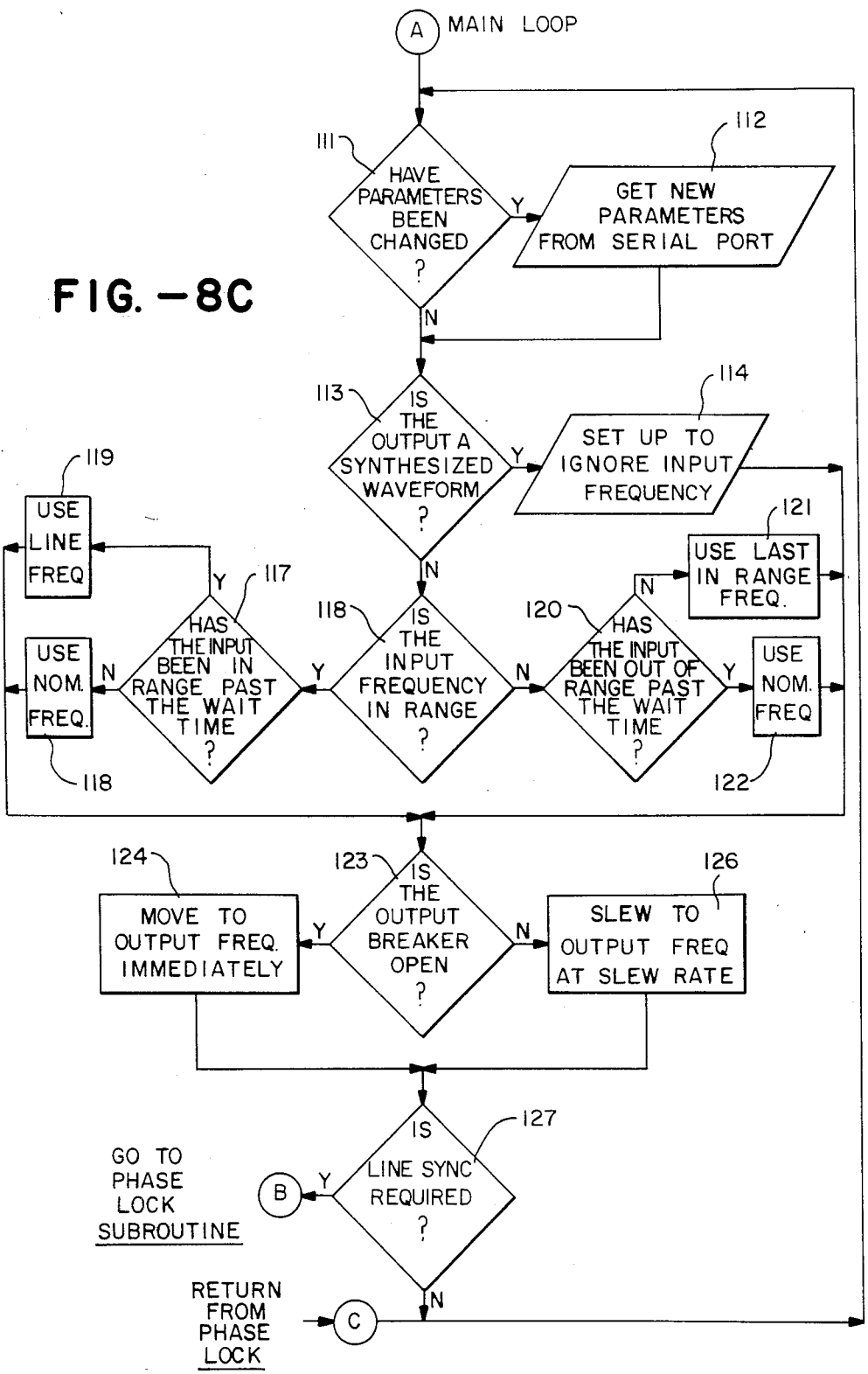

FIGS. 8A, 8B, 8C, and 8D are the flowcharts of the operation of microprocessor 62. In effect, there is a main control loop illustrated by the flowchart of FIG. 8C (having a subroutine of FIG. 8D) which runs in parallel with three real time interrupt driven processes as illustrated in FIG. 8B. In general the main loop of FIG. 8C performs the highest level control of the system; for example it will be determining whether the input signal on line 66 (FIG. 7) is within a specified lock range and whether it is necessary to slew to a desired output frequency. Each of the interrupt processes as shown in FIG. 8B performs a portion of the calculations necessary for the main loop (along with the subroutine of FIG. 8D) to make its decisions.

Referring briefly to the interrupt routines of FIG. 8B the interrupt routine 0 as set out in blocks 101 and 102 updates each of the software timers upon a hardware timer, as illustrated in block 101, rolling over on its count; in other words timing out. The software timers include timeout counters and period (frequency) measuring timers. Interrupt 2 shown in blocks 103 and 104 is called each time a rising edge is detected on either the input or output sine wave. Specifically these are the square waves shown by inputs 66 and 70 to microprocessor 62 in FIG. 7. This routine calculates the period and thus the frequency of the sine waves comparing them and providing a phase difference. Thus the basic functioning of the digital phase locked loop is implemented at this point. In addition in the interrupt routine the updating of the down counter 72 is also accomplished to avoid the possibility of this counter being loaded when a divide value was being outputted.

Finally in the interrupt 6 service routine shown as blocks 105 and 106 this routine is called each time a new instruction or character is received from the host computer or the proper input from the microprocessor 62 itself. Thus this might be used for example when the implementation of FIG. 2C is being utilized where the power supply is actually driving a vehicle and the input frequency must be continuously changed.

Thus there are four major tasks running concurrently in this system. They are (1) updating the software counter (interrupt 0); (2) determining the period (frequency) of the input and output sine waves (interrupt 2); (3) processing serial communications with the host (interrupt 6); and (4) performing the overall logic of the system including frequency and phase locking to the incoming sine wave or determining a desired or nominal frequency of operation.

Referring briefly to FIG. 8A the process first powers up in step 100, variables are initialized as shown in block 107, software timers initialized, block 108, communication ports initialized, block 109, and high speed interrupts initialized in block 110. Then as shown by the letter A the main loop of FIG. 8C is gone to. The main loop first checks in block 111 to determine whether any parameters have been changed. This is done via the interrupt 6 in 112 where any new parameters are gotten from the serial port. This is accomplished specifically by the interrupt 6 service routine which when it stores new parameter information sets a flag which indicates in step 112 that the parameters have changed. The main routine of course samples this flag in that step.

The next step in block 113 is to determine whether a desired or nominal frequency (see input 68 to microprocessor 62, FIG. 7) is to be utilized or whether the input frequency is to be locked to. Block 114 provides for operation on a desired frequency and bypasses the functions utilized for frequency locking. However in the normal case where the input frequency is to be locked to, the question is asked in block 116 whether the input frequency is in range. For example the range might be between 55 to 65 Hz.

In general the goal as illustrated by the functions following block 116 in asking whether the input frequency is in range is to track the input frequency as long as it stays within a window. Once it goes outside of such window, it is desired to wait at the edge of the window for a period of time to allow the frequency to come back within the range or window. On the other hand assuming the input frequency is in range and it has been out of range it is desired to wait a certain time before locking onto the input frequency. This is to prevent switching from the line to a synthesized or nominal frequency before it is absolutely necessary and vice versa.

Thus assuming the answer to whether or not the input frequency is "yes" then in block 117 the question is asked has the input been in range past the wait time.

In other words a software counter is being checked here. If the wait time has not expired then in block 118 a nominal frequency is used. However if the wait time has expired then as shown by block 119 line frequency is used.

In the case where the frequency is out of range and the question of block 116 is answered "no" then in block 121 the question is asked "has the input been out of range past the wait time." This as stated above is to prevent unnecessary switching of the frequency if the change of frequency was only short term. Thus if the wait time has not expired as shown by block 121 the last in range frequency is utilized. If the wait time has expired then a preset nominal frequency as illustrated in block 122 is gone to.

Next in block 123 the question is asked whether the output breaker is open. If so this means that any new frequency may be stepped to immediately (see block 124). However if a load is attached then it is desired to approach a new output frequency as illustrated in block 126 at a predetermined slew rate. For example the slew rate might be limited to 0.1 Hz/sec. to 2 Hz/sec. with a maximum step of 0.1 Hz. Note that the above process occurs whether the input frequency is to be locked to or a nominal or entirely arbitrary frequency as determined by input 68 (FIG. 7) is desired.

After the proper frequency is determined the next function is block 126 where it is asked whether phase locking or linesync is required. If not then a return is made to the top of the main loop at A. If phase locking is required then the phase lock subroutine designated by B is gone to. This is FIG. 8D. In general once the input and output frequencies match phase lock is attained by adjusting the output frequency slightly so that its phase will slowly start adjusting with respect to the input signal and all of this is performed by the routine of FIG. 8D. In general once the two phases are aligned a return is made to the main program loop of FIG. 8C. Thus the tracking of the input signal is continuous.

Figure 8D:
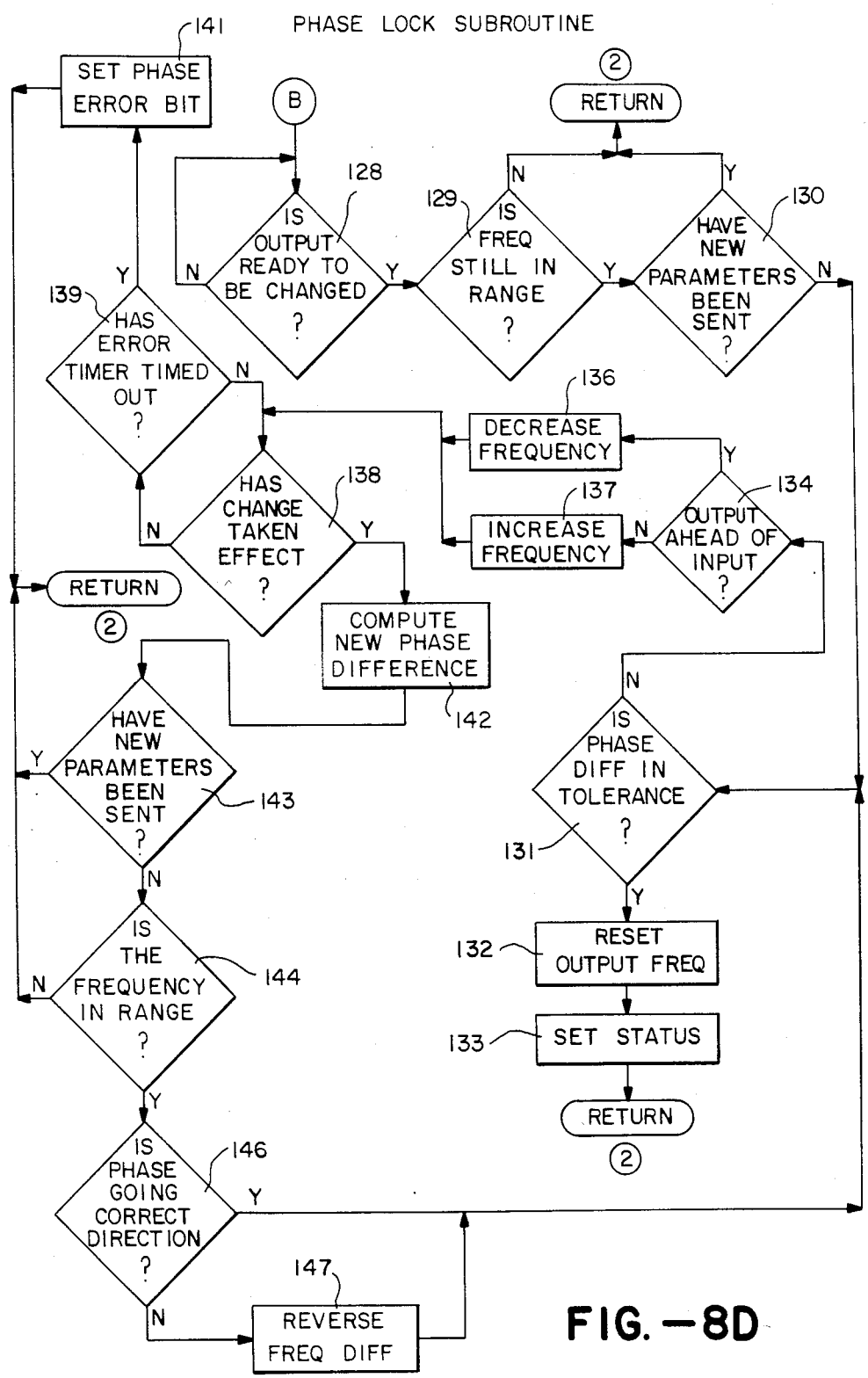

Referring specifically to the phase lock subroutine of FIG. 8D the housekeeping question is asked in block 128 whether or not the output is ready to be changed. If so block 129 checks whether or not the frequency is still in range and if so the question is asked in block 130 whether new parameters have been sent. If not the question is asked if the phase difference is already in tolerance in block 131. If so no further functioning is necessary and the output frequency is reset in block 132, the status is set in block 133, and a return made to the main loop.

However if there is a necessity for phase locking then in block 134 the question is asked is the output phase ahead of the input. This allows for the optimum direction of phase locking to take place. This occurs in either the decrease frequency block 136 or the increase frequency block 137. Then in block 138 the question is asked "has the change taken place." An error timer is provided in block 139 to set a phase error bit in block 141 if a change does not take place within a predetermined time. If not a return is made to the main routine. If the change has taken place the new phase difference is computed in block 142, housekeeping questions are asked in blocks 143 and 144 as to new parameters and whether the frequency is still in range (if not a return is made) and then in block 146 the direction of phase change is checked. If it is improper it is reversed in block 147. Then the loop is completed back to block 131 where it will be executed again if it is necessary to continue the step change of the phase. If not a return is made.

Thus, in summary, the digital phase locked loop provides for exact and controllable frequency tracking and phase locking with significantly greater transient response than analog feedback circuits, no overshoot or undershoot occurs as is true in analog circuitry, and there are digitally programmable slew rates, nominal frequency and lock range.

The power supply of the present invention is especially useful for AC or DC applications where commercial AC utility power is used as the input source. Most available power units, notably those which convert the line AC to DC, draw heavily distorted current from the utility system; e.g. they use SCR's whose turn-on time is phase controlled. This distortion can interfere with normal operation of the rest of the utility system. By using the same PWM technique employed by the present invention in the output stage, i.e., DC to AC, also in the input stage, i.e. AC to DC, but in a reverse mode, the above distortion is eliminated. Moreover, by use of the current mode control technique for generating the PWM signal for the input stage any kind of current can be programmed on the utility input line; e.g., from sine waves to triangular to square.

Although operation at 50 KHz is believed to provide optimal minimization of distortion and harmonics, it is possible to operate at a PWM frequency of, for example, 4 KHz. Thus, the various waveforms of FIG. 3 would have a basic frequency of 4 KHz (see FIG. 3C). When such a lower frequency is used, the criticality of switching is reduced, and thus the simplified switching network of FIG. 4B may be utilized in place of FIGS. 4 and 4A. Here the cascode switching pair Q1, Q2 is replaced by the single switching transistor Q1 and similarly the pair Q3, Q4 has been replaced by Q3. The base inputs of Q1 and Q3 are then driven by the pulse width modulated waveforms as indicated, but at the 4 KHz basic rate. The diodes D1 and D2 still are across the terminals of Q1 and Q3. In addition, the transistors are bypassed by the indicated R-C networks: R3, C3 and R4, C4. Finally, the turn on snubber network, L2, D7 and R5, is put in series rather than parallel in the DC bus line. And for a balanced circuit another turn on snubber network L2' is placed series in the return line, along with the diode D7' and resistor R5'.

With the lower frequency PWM operation of FIG. 4B, FIG. 5 would also be modified as shown in FIG. 5A, to provide a 4 KHz clock 82' replacing the 50 KHz clock 82. Also, at this lower frequency, a voltage mode operation may be preferred to current mode and thus the negative polarity input to comparator 47 may now be switched by a switch 50 between the existing current mode input on line 48 (from FIG. 1) and a voltage mode input which is provided by a triangular wave generator FIG. 50', having an operating frequency of 4 KHz. Naturally the output control circuit, as illustrated in FIG. 6, would have its ramp or triangular wave generator unit 61 operating at this kilohertz frequency.

Thus an improved uninterruptible power supply and power module has been provided.

We claim:

1. A power supply for converting single or multi-phase line AC in a regulated manner to a desired single or multi-phase output comprising:
   a plurality of substantially identical switched power modules connected in parallel to said AC line and to said output including input switching means switched by pulse width modulated signals for converting AC to DC and output switching means controlled by pulse width modulated signals for converting AC to DC and output switching means controlled by pulse width modulated signals for converting DC to AC; and
   input and output control means separate from said power modules for driving said switching means with said pulse width modulated signals whereby any one of said substantially identical switched power modules may be removed from said system without adversely affecting the remaining plurality of switched power modules, said output control means including digital phase locked loop means (PLL) for generating said pulse width modulated switching signal, said PLL including microprocessor means for comparing an output sinusoidal voltage generated by said PLL with an input sinusoidal voltage, and counter and memory means driven by said microprocessor means in accordance with said comparing, for producing said output sinusoidal voltage of a frequency determined by said microprocessor means.

2. A power supply as in claim 1 in which the electrical connection is made between the AC input through the plurality of switched power modules directly to the output without the use of a low frequency transformer coupling.

3. A power supply as in claim 1 where said counter and memory means includes a read only memory containing amplitudes of sine wave at sequential addresses which are addressed by said counter means and a multiplying digital to analog converter means driven by said memory means.

4. A power supply as in claim 3 where said microprocessor means provides a reference output to said multiplying digital to analog converter to determine the amplitude of said output sinusoidal voltage.

5. A power supply as in claim 4, including pulse width modulation signal forming means, including a comparator means comparing said sinusoidal output voltage with the actual AC output voltage of said power supply, the output of said comparator driving said pulse width modulation signal forming means.

6. A power supply as in claim 1 including an energy storage means between said input and output switching means connected between said DC bus and a return line.

7. A power supply as in claim 1 where said microprocessor means is selectively responsive to a said input voltage which is at said line frequency or a nominal frequency and includes means for slewing between said line and nominal frequency.

8. A power supply as in claim 1 where said microprocessor means provides a frequency operating range where if said line frequency goes outside of said range a nominal frequency is locked onto.

9. A power supply as in claim 1 together with a snubber means included in said switching means, including an inductor with a saturated core to minimize energy storage during turn-on.

10. A power supply as in claim 1 where each of said switching means includes cascode connected switches responsive to a single pulse width modulated input signal for providing a switching action.

11. A power supply as in claim 10 where said cascode switches each include a bipolar transistor which is rated at a high voltage and has relatively slow switching speed with its emitter coupled to a field effect transistor rated at a relatively low voltage but with a fast switching speed and providing said single input.

12. A power supply as in claim 10 where said cascode switches include in their input means for controlling the level of turn-on base current for said bipolar transistor.

13. A power supply as in claim 10 where said cascode switches include antisaturation clamp means.

14. A power supply as in claim 10 where said cascode switches include proportional base drive means.

15. A power supply as in claim 14 where said proportional base drive means include transformer means for supplying a proportional base current to said bipolar transistor.

16. A power supply as in claim 15 including means for resetting said transformer means within 10% or less of the period of the frequency of operation of said transformer.

17. A power supply as in claim 16 where said resetting means includes a winding on said transformer and means for applying a reset pulse to said winding for cyclically inverting the magnetic field of said transformer.

* * * * *

UNITED STATES PATENT AND TRADEMARK OFFICE
CERTIFICATE OF CORRECTION

PATENT NO. : 4,783,728
DATED : Nov. 8, 1988
INVENTOR(S) : David C. Hoffman

It is certified that error appears in the above—identified patent and that said Letters Patent is hereby corrected as shown below:

Claim 1, column 14, lines 36-38, delete the second occurrence of the phrase "and output switching means controlled by pulse width modulated signals for converting DC to AC"

Signed and Sealed this

Sixth Day of June, 1989

*Attest:*

DONALD J. QUIGG

*Attesting Officer*     *Commissioner of Patents and Trademarks*

UNITED STATES PATENT AND TRADEMARK OFFICE
CERTIFICATE OF CORRECTION

PATENT NO. : 4,783,728
DATED : Nov. 8, 1988
INVENTOR(S) : David C. Hoffman

It is certified that error appears in the above—identified patent and that said Letters Patent is hereby corrected as shown below:

Claim 1, column 14, lines 34-36, delete the phrase "and output switching means controlled by pulse width modulated signals for converting AC to DC"

This Certificate Supersedes Certificate Of Correction Issued June 6, 1989.

Signed and Sealed this

Fifth Day of December, 1989

Attest:

JEFFREY M. SAMUELS

Attesting Officer  Acting Commissioner of Patents and Trademarks